United States Patent
Han et al.

[11] Patent Number: 5,840,602
[45] Date of Patent: Nov. 24, 1998

[54] METHODS OF FORMING NONMONOCRYSTALLINE SILICON-ON-INSULATOR THIN-FILM TRANSISTORS

[75] Inventors: Min-Koo Han; Byung-Hyuk Min, both of Seoul; Cheol-Min Park, Kyungki-do; Byung-Seong Bae, Seoul, all of Rep. of Korea

[73] Assignee: Samsung Electronics Co., Ltd., Suwon, Rep. of Korea

[21] Appl. No.: 686,242

[22] Filed: Jul. 25, 1996

[30] Foreign Application Priority Data

Feb. 21, 1996 [KR] Rep. of Korea ............... 1696-4044

[51] Int. Cl.[6] ............... H01L 21/8238; H01L 21/84
[52] U.S. Cl. ............... 438/153; 438/154; 438/161; 438/164
[58] Field of Search ............... 438/149, 152, 438/153, 161, 163, 164, 165, 166, 223, 224, 227, 228, 155, 184, 201, 154

[56] References Cited

U.S. PATENT DOCUMENTS

| | | | |
|---|---|---|---|
| 5,318,919 | 6/1994 | Noguchi | 438/166 |
| 5,372,958 | 12/1994 | Miyasaka et al. | 438/166 |
| 5,488,005 | 1/1996 | Han et al. | 438/163 |
| 5,508,216 | 4/1996 | Inoue | 438/166 |
| 5,561,075 | 10/1996 | Nakazawa | 438/163 |

FOREIGN PATENT DOCUMENTS

| | | | |
|---|---|---|---|
| 2-206132 | 8/1990 | Japan . | |
| 4-120738 | 4/1992 | Japan | 438/184 |
| 6-13405 | 1/1994 | Japan | 438/184 |

*Primary Examiner*—Charles L. Bowers, Jr.
*Assistant Examiner*—Leon Radomsky
*Attorney, Agent, or Firm*—Myers Bigel Sibley & Sajovec

[57] ABSTRACT

Methods of forming thin-film transistors include the steps of forming an amorphous silicon (a-Si) layer of predetermined conductivity type on a face of an electrically insulating substrate and then forming a first insulating layer on the amorphous silicon layer. The first insulating layer and amorphous silicon layer are then patterned to define spaced amorphous source and drain regions having exposed sidewalls. An amorphous silicon channel region is then deposited in the space between the source and drain regions and in contact with the sidewalls thereof. An annealing step is then performed to convert the amorphous source, drain and channel regions to polycrystalline silicon, prior to the step of forming an insulated gate electrode on the channel region.

15 Claims, 4 Drawing Sheets

METHODS OF FORMING NONMONOCRYSTALLINE SILICON-ON-INSULATOR THIN-FILM TRANSISTORS

FIELD OF THE INVENTION

The present invention relates to semiconductor devices and methods of fabrication, and more particularly to thin-film transistors and methods of forming thin-film transistors.

BACKGROUND OF THE INVENTION

At present, the dominant methods for fabricating liquid crystal display devices (LCD) and panels are methods based on amorphous silicon (a-Si) thin-film transistor (TFT) technologies. Using these technologies, high quality image displays of substantial size can be fabricated using low temperature processes. As will be understood by those skilled in the art, conventional LCD devices typically include a transparent (e.g., glass) substrate with an array of thin film transistors thereon, pixel electrodes, orthogonal gate and data lines, a color filter substrate and liquid crystal material between the transparent substrate and color filter substrate. The use of a-Si TFT technology also typically requires the use of separate peripheral integrated circuitry to drive the gates and sources of the TFTs in the array.

However, because polycrystalline silicon typically has a higher free carrier electrical mobility relative to amorphous silicon, it has also been considered as a potentially appropriate semiconductor for thin-film transistor technologies. Moreover, thin-film transistors having polycrystalline silicon active regions can be used simultaneously in the peripheral integrated circuitry needed to drive the transistors in the display array. The use of polycrystalline silicon thin-film transistors in the display and peripheral circuitry also typically improves yield and reduces the cost and complexity of the thin-film methods based thereon.

Figure 1A:
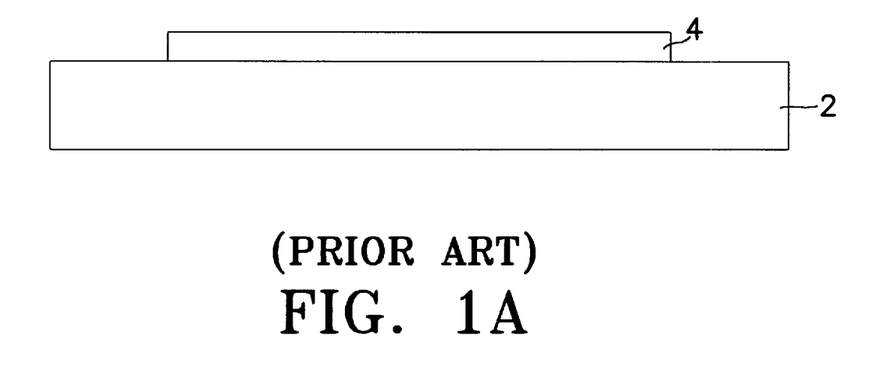
FIGS. 1A–1E illustrate schematic cross-sectional views of intermediate structures illustrating a method of forming a thin-film transistor (TFT) according to the prior art.
Figure 1B:
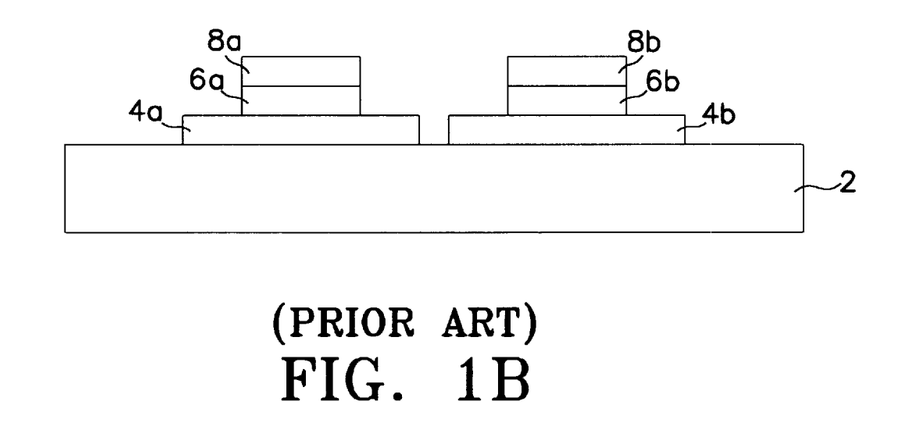
Figure 1C:
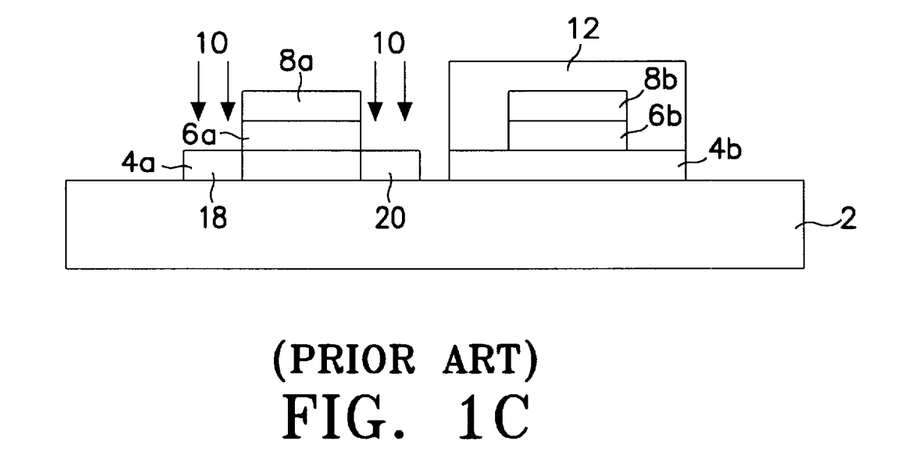

One conventional method of forming thin-film transistors containing polycrystalline silicon is disclosed in FIGS. 1A–1E. For example, in FIG. 1A, an active region 4 of polycrystalline silicon is first deposited on a face of an electrically insulating substrate 2 comprising quartz, glass or sapphire, and then etched. As illustrated by FIG. 1B, a gate oxide layer 6 and a polycrystalline silicon layer 8 are then sequentially deposited on the active region 4. These layers are then patterned using conventional techniques to define two adjacent mesa structures defined by regions 4a–8a and 4b–8b, respectively. Referring now to FIG. 1C, first conductivity type dopants 10 are then implanted into a first polycrystalline active region 4a to define source and drain regions 18, 20, using a first insulated gate electrode and photoresist pattern 12 as a mask. Here, the first insulating gate electrode comprises a first gate oxide layer 6a and first gate 8a. As will be understood by those skilled in the art, the portion of the first active region 4a covered by the first insulated gate electrode defines a self-aligned channel region of a first conductivity type thin-film transistor.

Figure 1D:
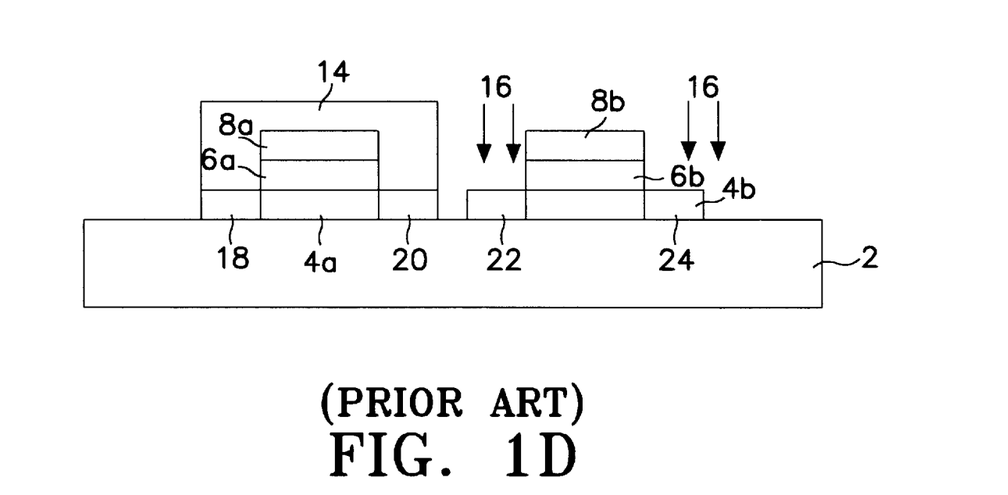
Figure 1E:
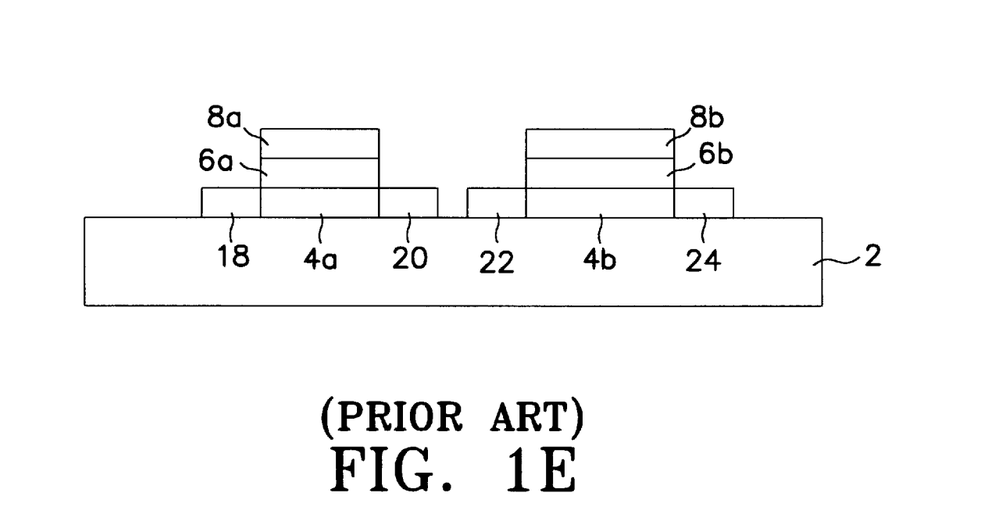

Referring now to FIG. 1D, second conductivity type dopants 16 are then implanted into a second polycrystalline active region 4b to define source and drain regions 22, 24, using a second insulated gate electrode and photoresist pattern 14 as a mask. Here, the second insulating gate electrode comprises a second gate oxide layer 6b and second gate 8b. The portion of the second active region 4b covered by the second insulated gate electrode defines a channel region of a second conductivity type thin-film transistor. Accordingly, the structures of FIG. 1E collectively define a pair of co-planar complimentary metal-oxide-semiconductor (CMOS) thin-film polycrystalline transistors (TFT), which are electrically isolated from each other by the electrically insulating substrate 2.

As will be understood by those skilled in the art, one benefit of the above method is the reduction in parasitic gate-source/drain capacitance which is achieved because the source and drain regions are formed in a self-aligned manner to the insulated-gate electrode. However, the steps of implanting the source and drain region dopants typically causes damage in the form of lattice defects in the polycrystalline silicon. The amount damage is a function of the ion-implant energy and dose. Here, such defects typically cause a reduction in electrical mobility of the polycrystalline silicon and deterioration in the electrical characteristics of the transistors. To reduce the extent of the ion-implant damage and simultaneously activate the implanted dopants, an additional annealing step is typically required. However, ion-implantation of dopants may not be suitable for large area displays having dimensions greater than five (5) square inches, because conventional ion-implant tools typically cannot provide uniform dose levels and energy simultaneously over such a large area.

Thus, notwithstanding the above described method of forming thin-film transistors, there still continues to be a need for improved methods which do not result in ion-implant damage, large parasitic gate-source/drain capacitance and which can be utilized to form large area displays based on TFT technologies.

SUMMARY OF THE INVENTION

It is therefore an object of the present invention to provide improved methods of forming thin-film transistors.

It is another object of the present invention to provide methods of forming thin-film transistors for large area displays.

It is still another object of the present invention to provide methods of forming thin-film transistors with reduced susceptibility to ion-implant induced damage.

It is a further object of the present invention to provide methods of forming thin-film transistors having reduced parasitic gate-source/drain capacitance.

These and other objects, features and advantages of the present invention are provided by methods of forming thin-film transistors (TFT) which include the steps of forming an amorphous silicon (a-Si) layer of predetermined conductivity type on a face of an electrically insulating substrate and then forming a first insulating layer on the amorphous silicon layer. The first insulating layer and amorphous silicon layer are then patterned to define spaced amorphous source and drain regions having exposed sidewalls. An amorphous silicon channel region is then deposited in the space between the source and drain regions and in contact with the sidewalls thereof. An annealing step is then performed to convert the amorphous source, drain and channel regions to polycrystalline silicon, prior to the step of forming an insulated gate electrode on the channel region.

In particular, a preferred method of forming nonmonocrystalline thin-film transistors includes the steps of initially depositing an electrically insulating layer on a face of substrate comprising a material selected from the group consisting of quartz, glass, sapphire or combinations thereof. A plurality of alternating silicon and insulating layers are then formed on a upper surface of the electrically insulating layer. Here, a first layer is formed on the upper surface by depositing an in-situ doped amorphous silicon (a-Si) layer of first conductivity type (e.g., N-type) on the electrically insulating layer. Then, a first insulating layer is formed on the first amorphous silicon layer, opposite the upper surface. An in-situ doped amorphous silicon layer of second conductivity type (e.g., P-type) is then formed on the first insulating layer. Finally, a second insulating layer is formed on the amorphous silicon layer of second conductivity type. A conventional patterning step, such as an etching step, is then preferably performed to define an isolated mesa containing the alternating layers on an upper surface of the electrically insulating layer.

A layer of photoresist is then applied to an upper surface of the second insulating layer and patterned to form a first photolithographic mask. An etching step is then selectively performed to pattern the second insulating layer and the amorphous silicon layer of second conductivity type, on the first insulating layer. In particular, the etching step is performed to define spaced amorphous regions of second conductivity type having respective insulating layers thereon. Another layer of photoresist is then applied to an upper surface of the first insulating layer and patterned to form a second photolithographic mask covering the spaced amorphous regions of second conductivity type. An etching step is then selectively performed to pattern the first insulating layer and the amorphous silicon layer of first conductivity type, on the electrically insulating layer. In particular, the etching step is performed to define spaced amorphous regions of first conductivity type having respective insulating layers thereon.

A layer of amorphous silicon having a thickness in a range between about 500–1000 Å is then deposited conformally so that electrical contact is made between the layer of amorphous silicon and the exposed sidewalls of the spaced amorphous regions. In addition, to improve the electrical mobility of free carriers in the layer of amorphous silicon and the spaced amorphous regions and to achieve other benefits, the regions of amorphous silicon are at least partially recrystallized to reduce the density of lattice defects therein. This is preferably achieved by annealing the regions of amorphous silicon at a temperature greater than about 500° C. for a duration greater than about 10 hours, and more preferably at a temperature of about 600° C. for a duration of about 30 hours, to convert the regions of amorphous silicon to polycrystalline silicon.

A gate insulating layer and a gate electrode layer, having a thickness of about 300 Å and formed of a material selected from the group consisting of doped and undoped polycrsytalline silicon and metal, are then sequentially formed on the annealed layer. Respective insulated gate electrodes for the first conductivity type TFT and second conductivity type TFT are then preferably formed by patterning the gate insulating layer and gate electrode layer, by performing an etching step using a mask. Here, the annealed layer is also patterned to form the channel regions of the transistors. According to a preferred aspect of the present invention, the spacing between each gate electrode and corresponding source/drain region is made relatively large by not removing the first and second insulating layers and by forming the corresponding channel region thereon so that any gate-induced electric fields in the gate insulating layer terminate in the channel region.

Conventional techniques are then to deposit a passivation layer having a thickness of about 5000 Å and at a temperature of about 380° C., on the thin-film transistors. Openings are then defined in the passivation layer to expose the respective source, drain and gate electrodes of the transistors and then metallization (e.g., aluminum) is deposited in the openings and patterned to form respective contacts to these regions. The contacts may then be exposed to a hydrogen containing plasma at a temperature of about 300° C., pressure of about 0.5 torr, power density of about 2.5 Wcm$^{-2}$ and frequency of about 13.56 MHz, to complete the transistor.

Thus, the above described steps illustrated a preferred method of forming complementary silicon-on-insulator thin-film transistors which are electrically isolated from each other, at adjacent locations on an electrically insulating substrate. In particular, the parasitic gate-source and gate-drain capacitance is reduced by increasing the spacing between the source/drain regions and the gate electrodes, using the insulating layers. Moreover, by in-situ doping the source/drain regions, ion-implant damage is eliminated.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type and each embodiment described and illustrated herein includes its complementary embodiment as well.

Figure 2A:
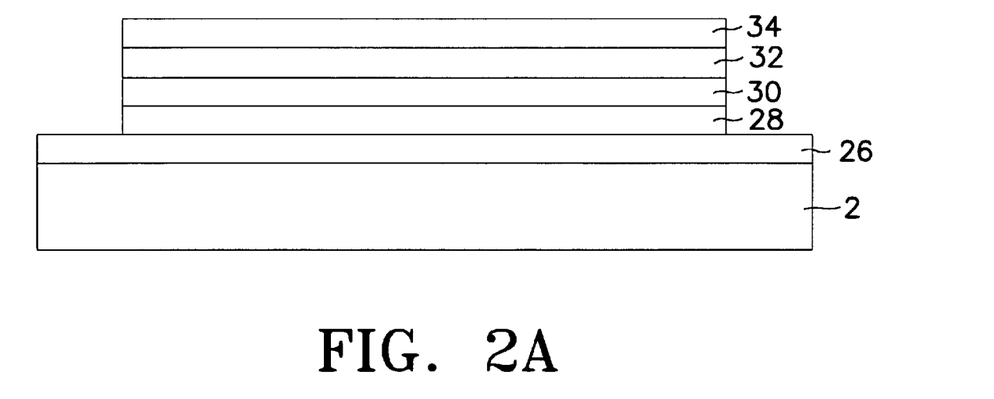
FIGS. 2A–2E illustrate schematic cross-sectional views of intermediate structures illustrating a preferred method of forming thin-film transistors according to the present invention.

Referring now to FIGS. 2A–2E, a preferred method of forming nonmonocrystalline silicon-on-insulator (SOI) field effect transistors will be described. In particular, FIG. 2A illustrates the steps of initially depositing an electrically insulating layer 26 having a thickness of about 5000 Å on a face of substrate 2 comprising a material selected from the group consisting of quartz, glass, sapphire or combinations thereof. Alternatively, the substrate 2 may comprise a monocrystalline silicon substrate of predetermined conductivity type and the electrically insulating layer 26 may be formed on the monocrystalline silicon substrate by oxidizing a face thereof at relatively high temperatures, as will be understood by those skilled in the art. As described hereinbelow, the electrically insulating layer 26 and substrate 2 may individually and collectively form an electrically insulating substrate.

Referring still to FIG. 2A, a plurality of alternating silicon and insulating layers 28–34 are then formed on a upper surface of the electrically insulating layer 26. Here, a first layer is formed on the upper surface by depositing an in-situ doped amorphous silicon (a-Si) layer 28 of first conductivity type (e.g., N-type) having a thickness of about 1000 Å, on the electrically insulating layer 26. Then, a first insulating layer 30 or buffer layer having a thickness of about 1000 Å is formed on the first amorphous silicon layer 28, opposite the upper surface. The first insulating layer 30 may comprise silicon dioxide (SiO$_2$) or an equivalent insulating layer such as silicon nitride (Si$_3$N$_4$). An in-situ doped amorphous silicon layer 32 of second conductivity type (e.g., P-type) having a thickness of about 1000 Å, for example, is then formed on the first insulating layer 30, as illustrated. Finally, a second insulating layer 34 also having a thickness of about 1000 Å is formed on the amorphous silicon layer 32 of second conductivity type. Here, the first and second insulating layers 30, 34 and the amorphous silicon layer of second conductivity type 32 may be formed using conventional techniques, such as low pressure chemical vapor deposition (LPCVD) or atmospheric pressure chemical vapor deposition (APCVD). A conventional patterning step, such as an etching step, is then preferably performed to define an isolated mesa containing the alternating layers 28–34, on an upper surface of the electrically insulating layer 26.

Figure 2B:
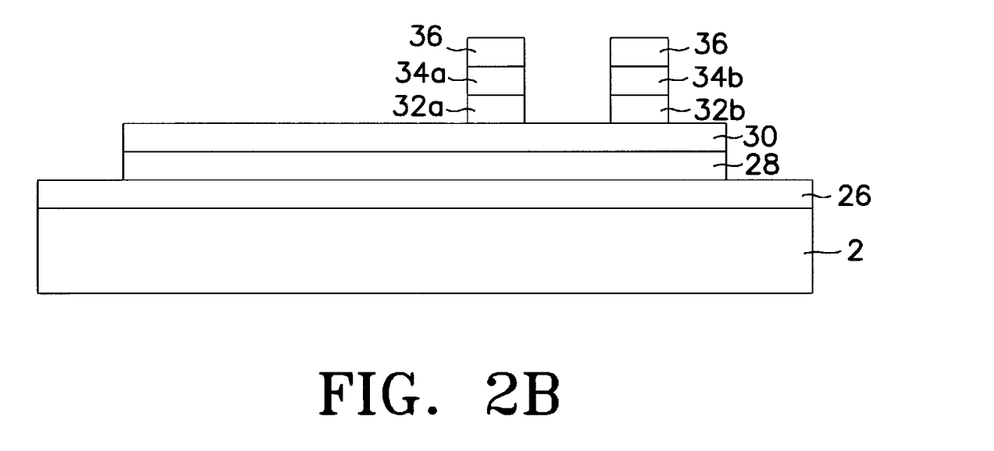

Referring now to FIG. 2B, a layer of photoresist is then applied to an upper surface of the second insulating layer 34 and patterned to form a first photolithographic mask 36. An etching step is then selectively performed to pattern the second insulating layer 34 and the amorphous silicon layer 32 of second conductivity type, on the first insulating layer 30. In particular, the etching step is performed to define spaced amorphous regions 32a, 32b of second conductivity type having respective insulating layers 34a, 34b thereon, as illustrated. Stated alternatively, the etching step is performed to define an opening which exposes a portion of an upper surface of the first insulating layer 30 extending between the spaced amorphous regions 32a, 32b of second conductivity type. As described more fully hereinbelow, the spaced amorphous regions 32a, 32b can be utilized as spaced source and drain regions of a second conductivity type (e.g., P-type) thin-film field effect transistor (TFT).

Figure 2C:
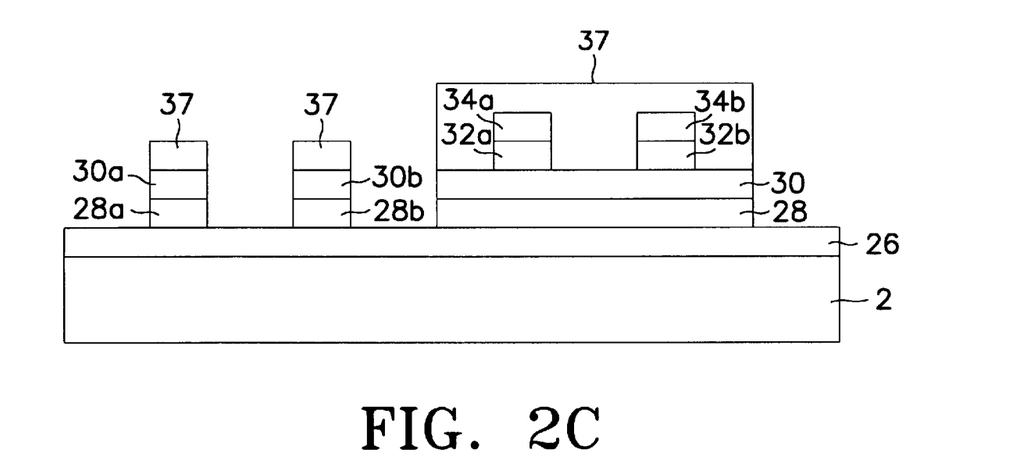

Referring now to FIG. 2C, another layer of photoresist is then applied to an upper surface of the first insulating layer 30 and patterned to form a second photolithographic mask 37 covering the spaced amorphous regions 32a, 32b of second conductivity type. An etching step is then selectively performed to pattern the first insulating layer 30 and the amorphous silicon layer 28 of first conductivity type, on the electrically insulating layer 26. In particular, the etching step is performed to define spaced amorphous regions 28a, 28b of first conductivity type having respective insulating layers 30a, 30b thereon, as illustrated. Stated alternatively, the etching step is performed to define an opening which exposes a portion of an upper surface of the electrically insulating layer 26 extending between the spaced amorphous regions 28a, 28b of first conductivity type. As described more fully hereinbelow, the spaced amorphous regions 28a, 28b of first conductivity type can be utilized as spaced source and drain regions of a first conductivity type (e.g., N-type) thin-film field effect transistor (TFT).

Figure 2D:
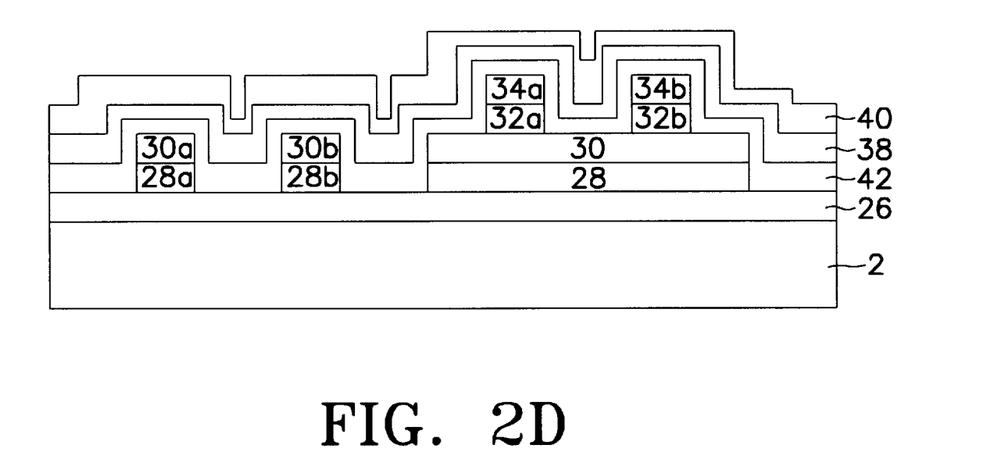

Referring now to FIG. 2D, a layer 42 of amorphous silicon having a thickness in a range between about 500–1000 Å is then deposited conformally on the structure of FIG. 2C and into the openings defined by the spaced amorphous regions 28a, 28b of first conductivity type and the spaced amorphous regions 32a, 32b of second conductivity type, as illustrated. Here, the layer 42 of amorphous silicon is deposited so that electrical contact is made between the layer 42 of amorphous silicon and the exposed sidewalls of the spaced amorphous regions 28a–b and 32a–b. In addition, to improve the electrical mobility of free carriers in the layer 42 of amorphous silicon and the spaced amorphous regions 28a–b and 32a–b and to achieve other benefits, the regions of amorphous silicon are at least partially recrystallized to reduce the density of lattice defects therein. This is preferably achieved by annealing the regions of amorphous silicon at a temperature greater than about 500° C. for a duration greater than about 10 hours, and more preferably at a temperature of about 600° C. for a duration of about 30 hours, to convert the regions of amorphous silicon to polycrystalline silicon.

Figure 2E:
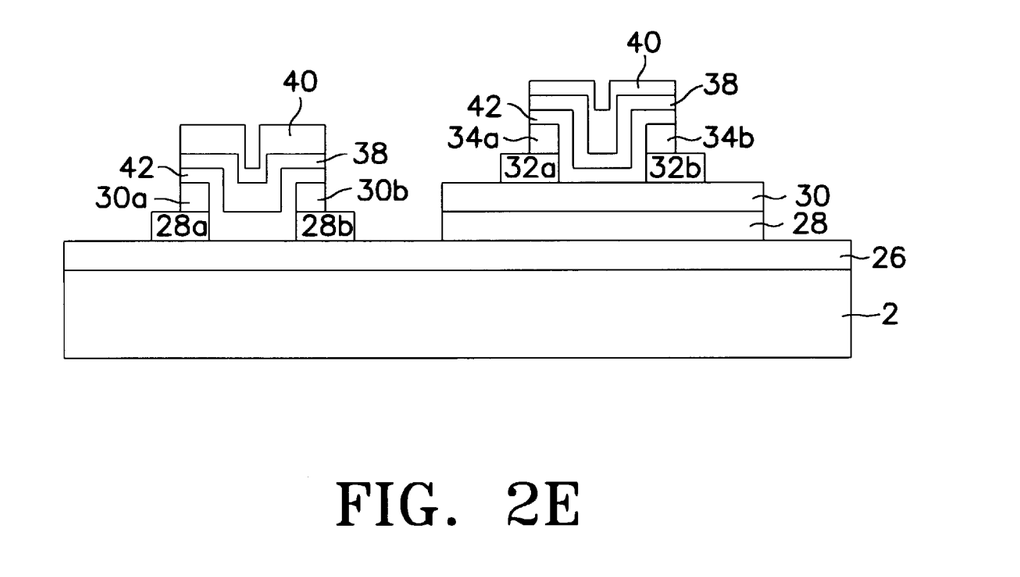

Referring still to FIG. 2D, a gate insulating layer 38 (e.g., SiO$_2$) and a gate electrode layer 40, having a thickness of about 300 Å and formed of a material selected from the group consisting of doped and undoped polycrsytalline silicon and metal, are then sequentially formed on the annealed layer 42. Referring now to FIG. 2E, respective insulated gate electrodes for the first conductivity type TFT (containing spaced source and drain regions 28a–b) and second conductivity type TFT (containing spaced source and drain regions 32a–b) are then preferably formed by patterning the gate insulating layer 38 and gate electrode layer 40, by performing an etching step using a mask (not shown). Here, the annealed layer 42 is also patterned to form the channel regions 42 of the transistors. According to a preferred aspect of the present invention, the spacing between each gate electrode 40 and corresponding source/drain region (28a–b, 32a–b) is made relatively large by not removing the first and second insulating layers (30a–b, 34a–b) and by forming the corresponding channel region 42 thereon so that any gate-induced electric fields in the gate insulating layer 38 terminate in the channel region 42.

Conventional techniques are then preferably performed to deposit a passivation layer (not shown) having a thickness of about 5000 Å and at a temperature of about 380° C., on the thin-film transistors. Openings are then defined in the passivation layer to expose the respective source, drain and gate electrodes of the transistors and then metallization (e.g., aluminum) is deposited in the openings and patterned to form respective contacts to these regions. The contacts may then be exposed to a hydrogen containing plasma at a temperature of about 300° C., pressure of about 0.5 torr, power density of about 2.5 Wcm$^{-2}$ and frequency of about 13.56 MHz, to complete the transistor.

Accordingly, the steps of FIGS. 2A–2E illustrated a preferred method of forming complementary silicon-on-insulator thin-film transistors which are electrically isolated from each other, at adjacent locations on an electrically insulating substrate. In particular, as illustrated best by FIG. 2E, the parasitic gate-source and gate-drain capacitance is reduced by increasing the spacing between the source/drain regions (28a–b, 32a–b) and the gate electrodes, using the insulating layers 30a–b, 34a–b. Moreover, by in-situ doping the source/drain regions, ion-implant damage is eliminated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming nonmonocrystalline complimentary metal oxide semiconductor thin-film transistors, comprising the steps of:

forming a first silicon layer of first conductivity type on an electrically insulating substrate;

forming a first insulating layer on the first silicon layer, opposite the substrate;

forming a second silicon layer of second conductivity type on the first insulating layer, opposite the first silicon layer;

patterning the second silicon layer to define spaced source and drain regions of second conductivity type having exposed sidewalls;

patterning the first silicon layer to define spaced source and drain regions of first conductivity type having exposed sidewalls;

forming a first amorphous silicon channel region in contact with the exposed sidewalls of the spaced amorphous source and drain regions of first conductivity type;

forming a second amorphous silicon channel region in contact with the exposed sidewalls of the spaced amorphous source and drain regions of second conductivity type;

converting the first and second amorphous silicon channel regions to polycrystalline silicon;

forming a first insulated gate electrode on the first channel region; and forming a second insulated gate electrode on the second channel region.

2. The method of claim 1, wherein said patterning steps are preceded by the step of etching the second silicon layer, the first insulating layer and the first silicon layer to define a mesa on the electrically insulating substrate.

3. The method of claim 2, wherein said etching step is preceded by the step of forming a second insulating layer on the second silicon layer, opposite the first insulating layer.

4. The method of claim 1, wherein said first and second amorphous silicon channel region forming steps are performed simultaneously; and wherein said first and second insulated gate electrode forming steps are performed simultaneously.

5. The method of claim 1, wherein the substrate comprises an insulating material selected from the group consisting of quartz, sapphire, glass and combinations thereof.

6. The method of claim 5, wherein the substrate comprises a layer of silicon dioxide having a thickness greater than about 2500 Å on a face of the insulating material; and wherein said first silicon layer forming step comprises forming a first amorphous silicon layer of first conductivity type on the layer of silicon dioxide.

7. The method of claim 9, wherein said step of patterning the second silicon layer comprises patterning the second silicon layer in the mesa to define spaced source and drain regions of second conductivity type having exposed sidewalls.

8. The method of claim 7, wherein said step of patterning the first silicon layer follows said step of patterning the second silicon layer and comprises patterning the first silicon layer in the mesa to define spaced source and drain regions of first conductivity type having exposed sidewalls.

9. The method of claim 4, wherein said steps of patterning the first and second silicon layers comprises etching the first and second silicon layers, respectively.

10. The method of claim 9, wherein said steps of patterning the first silicon layer comprises patterning a photoresist layer on the patterned second silicon layer and then etching the first silicon layer using the patterned photoresist layer as a etching mask.

11. The method of claim 1, wherein said converting step comprises annealing the first and second amorphous silicon channel regions.

12. The method of claim 11, wherein said annealing step comprises annealing the first and second amorphous silicon channel regions simultaneously at a temperature of about 500° C. for a duration greater than about 10 hours.

13. A method of forming silicon-on-insulator field effect transistors, comprising the steps of;

forming an amorphous silicon layer of first conductivity type on an electrically insulating substrate; then forming a first insulating layer on the amorphous silicon layer of first conductivity type;

forming an amorphous silicon layer of second conductivity type on the first insulating layer;

patterning the amorphous silicon layer of second conductivity type to define spaced amorphous source and drain regions of second conductivity type having exposed sidewalls;

patterning the first insulating layer and the amorphous silicon layer of first conductivity type to define spaced amorphous source and drain regions of first conductivity type having exposed sidewalls; then forming a first amorphous silicon channel region on the first insulating layer, in contact with the exposed sidewalls of the spaced amorphous source and drain regions of first conductivity type;

forming a second amorphous silicon channel region in contact with the exposed sidewalls of the space amorphous source and drain regions second conductivity type;

annealing the first amorphous silicon channel region, the spaced amorphous source and drain regions of first conductivity type, the second amorphous silicon channel region and the spaced amorphous source and drain regions of second conductivity type at a temperature greater than about 500° C. for a duration greater than about 10 hours;

forming a first insulated gate electrode on the annealed first channel region; and forming a second insulated gate electrode on the annealed second channel region.

14. A method of forming semiconductor-on-insulator field effect transistors, comprising the steps of;

forming an amorphous semiconductor layer of first conductivity type on an electrically insulating substrate; then forming a first insulating layer on the amorphous semiconductor layer of first conductivity type;

forming an amorphous semiconductor layer of second conductivity type on the first insulating layer;

patterning the amorphous semiconductor layer of second conductivity type to define spaced amorphous source and drain regions of second conductivity type having exposed sidewalls;

patterning the first insulating layer and the amorphous semiconductor layer of first conductivity type to define spaced amorphous source and drain regions of first conductivity type having exposed sidewalls; then forming a first amorphous semiconductor channel region on the first insulating layer, in contact with the exposed sidewalls of the spaced amorphous source and drain regions of first conductivity type;

forming a second amorphous semiconductor channel region in contact with the exposed sidewalls of the spaced amorphous source and drain regions of second conductivity type;

forming a second amorphous semiconductor channel region in contact with the exposed sidewalls of the spaced amorphous source and drain regions of second conductivity type;

annealing the first amorphous semiconductor channel region, the spaced amorphous source and drain regions of first conductivity type, the second amorphous semiconductor channel region and the spaced amorphous source and drain regions of second conductivity type at a temperature greater than about 500° C. for a duration greater than about 10 hours;

forming a first insulated gate electrode on the annealed first channel region; and forming a second insulated gate electrode on the annealed second channel region.

15. A method of forming semiconductor-on-insulator field effect transistors, comprising the steps of:

forming an nonmonocrystalline semiconductor layer of first conductivity type on an electrically insulating substrate; then forming a first insulating layer on the nonmonocrystalline semiconductor layer of first conductivity type;

forming an nonmonocrystalline semiconductor layer of second conductivity type on the first insulating layer;

patterning the nonmonocrystalline semiconductor layer of second conductivity type to define spaced nonmonocrystalline source and drain regions of second conductivity type having exposed sidewalls;

patterning the first insulating layer and the nonmonocrystalline semiconductor layer of first conductivity type to define spaced nonmonocrystalline source and drain regions of first conductivity type having exposed sidewalls; then forming a first nonmonocrystalline semiconductor channel region on the first insulating layer, in contact with the exposed sidewalls of the spaced nonmonocrystalline source and drain regions of first conductivity type;

forming a second nonmonocrystalline semiconductor channel region in contact with the exposed sidewalls of the spaced nonmonocrystalline source and drain regions of second conductivity type;

annealing the first nonmonocrystalline semiconductor channel region, the spaced nonmonocrystalline source and drain regions of first conductivity type, the second nonmonocrystalline semiconductor channel region and the spaced nonmonocrystalline source and drain regions of second conductivity type at a temperature greater than about 500° C. for a duration greater than about 10 hours;

forming a first insulated gate electrode on the annealed first channel region; and forming a second insulated gate electrode on the annealed second channel region.

* * * * *

UNITED STATES PATENT AND TRADEMARK OFFICE
CERTIFICATE OF CORRECTION

PATENT NO. : 5,840,602
DATED : November 24, 1998
INVENTOR(S) : Han et al.

It is certified that error appears in the above-identified patent and that said Letters Patent is hereby corrected as shown below:

On the Cover Page: Item
[30]            Delete "1696-4044" and substitute -- 1996-4004 -- therefor.

In the Claims:
Column 7, Line 43       Delete "9" and substitute -- 2 -- therefor.
Column 8, Line 23       Delete "space" and substitute -- spaced -- therefor.
Column 8, Line 24       Add the word -- of -- after "regions"
Column 8, Lines 64-67   Delete the text beginning with the word "forming" through the word "type;"

Signed and Sealed this

Sixteenth Day of March, 1999

Attest:

Q. TODD DICKINSON

*Attesting Officer*        *Acting Commissioner of Patents and Trademarks*